US008456164B2

(12) United States Patent
Subbarao

(10) Patent No.: US 8,456,164 B2
(45) Date of Patent: Jun. 4, 2013

(54) METHODS AND APPARATUSES FOR 3D MAGNETIC DENSITY IMAGING AND MAGNETIC RESONANCE IMAGING

(76) Inventor: Muralidhara Subbarao, Stony Brook, NY (US)

( * ) Notice: Subject to any disclaimer, the term of this patent is extended or adjusted under 35 U.S.C. 154(b) by 440 days.

(21) Appl. No.: 12/927,653

(22) Filed: Nov. 20, 2010

(65) Prior Publication Data
US 2012/0126811 A1    May 24, 2012

(51) Int. Cl.
*G01V 3/14*    (2006.01)
*G01R 33/48*    (2006.01)

(52) U.S. Cl.
USPC ............ 324/309; 324/313; 324/318; 324/319; 600/407; 600/409; 382/128

(58) Field of Classification Search
USPC .... 324/300–322; 600/407–465; 382/128–131
See application file for complete search history.

(56) References Cited

U.S. PATENT DOCUMENTS

| | | | |
|---|---|---|---|
| 5,794,620 A * | 8/1998 | Dossel et al. | 60/407 |
| 2011/0115485 A1 * | 5/2011 | Subbarao | 324/309 |
| 2012/0280684 A1 * | 11/2012 | Kim et al. | 324/309 |

OTHER PUBLICATIONS

M. Sbbarao, "Method and apparatus for high-sensitivity Single-Photon Emission Computed Tomography", U.S. Appl. No. 12/586,863, filed Sep. 29, 2009.
M. Subbarao, "Field Image Tomography for Magnetic Resonance Imaging", U.S. Appl. No. 12/658,001, filed Feb. 1, 2010.
M. Subbarao, "Methods and apparatuses for 3D Imaging in Magnetoencephalography and Magnetocardiography", U.S. Appl. No. 12/924,959, filed Oct. 9, 2010.

* cited by examiner

*Primary Examiner* — Melissa Koval
*Assistant Examiner* — Emily Chan

(57) ABSTRACT

Three-dimensional (3D) tomographic image of a target object such as soft-tissue in humans is obtained in the method and apparatus of the present invention. The target object is first magnetized by a polarizing magnetic field pulse. The magnetization of the object is specified by a 3D spatial Magnetic Density image (MDI). The magnetic field due to the magnetized Object is measured in a 3D volume space that extends in all directions Including substantially along the radial direction, not just on a surface as in prior art. This measured data includes additional information overlooked in prior art and this data is processed to obtain a more accurate 3 D image reconstruction in lesser time than in prior art. The methods and apparatuses of the present invention are combined with frequency and phase encoding techniques of Magnetic Resonance imaging (MRI) technique in prior art to achieve different trade-offs.

9 Claims, 6 Drawing Sheets

Figure 1:
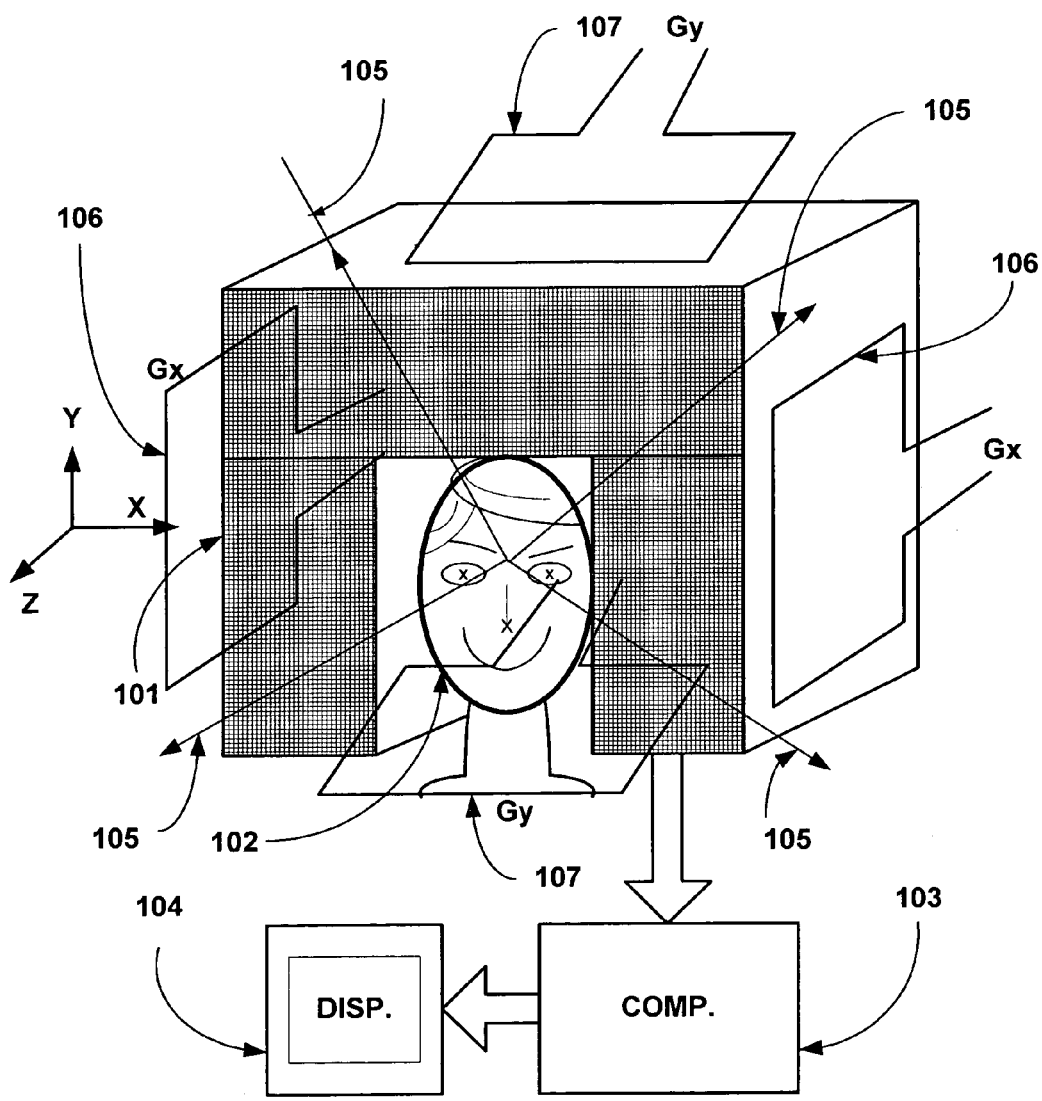

Apply a polarizing magnetic field p(r1) for a short time period (e.g. 1 second) in volume V1 occupied by an object to be imaged. This results in the magnetization of the material in the object with magnetic dipole intensity f(r1). The magnetized object generates a magnetic field g(r2) around the object. Turn off p(r1) and then measure g(r2) at a set of points r2 in a 3D volume space V2 that in particular extends substantially along the radial direction pointing away from the center of the object. At each point r2, measure along at least one and possibly more directions.

Determine a system matrix H(r1,r2) which specifies magnetic field intensity characteristics at any point r2 produced by a magnetic dipole source of unit strength located at any other point r1. This system matrix H(r1,r2) is determined based on magnetic field propagation characteristics from a magnetic dipole, as well as magnetic field measurement apparatus characteristics such as direction, dimensions, and geometry of magnetic flux sensor elements..

Set up a vector-matrix equation g(r2)=H(r1,r2) f(r1)+n(r2) where n(r2) represents noise in measured data at point r2.

Solve the vector-matrix equation g(r2)=H(r1,r2) f(r1)+n(r2) and estimate a solution f1(r1) for the 3D image f(r1) using a method that reduces the effect of noise n(r2) so that estimated solution f1(r1) is close to desired solution f(r1). Solution may be obtained through computations in the Fourier domain or the spatial domain.

FIG. 5

Apply a polarizing magnetic field p(r1) for a short time period (e.g. 0.5 second) in volume V1 occupied by an object to be imaged. This results in the magnetization of the material in the object with magnetic dipole intensity f(r1). The magnetized object generates a magnetic field g(r2) around the object. Turn off p(r1).

A pulse of readout or measurement magnetic field Bm(r) is applied as in MRI. This field Bm(r) is applied perpendicular to the original polarizing magnetic field p(r). Simultaneously while applying Bm(r), another pulse of a frequency encoding gradient magnetic field Gx is applied along the x-axis. The readout field Bm(r) is reversed so as to generate a radio frequency gradient echo signal. [Optional step: simultaneously with Bm(r), reverse Gx also.] Then measure g(r2,k(t)) at a set of points r2 in a 3D volume space V2 that in particular extends substantially along the radial direction pointing away from the center of the object. At each point r2, measure along at least one and possibly more directions.

Determine a system matrix H(r1,r2) which specifies magnetic field intensity characteristics at any point r2 produced by a magnetic dipole source of unit strength located at any other point r1. This system matrix H(r1,r2) is determined based on magnetic field propagation characteristics from a magnetic dipole, as well as magnetic field measurement apparatus characteristics such as direction, dimensions, and geometry of magnetic flux sensor elements..

Frequency decode g(r2,k(t)) through a Fourier transformation to obtain modified g(r2). This localizes the x-coordnate.
Set up a vector-matrix equation g(r2)=H(r1,r2) f(r1)+n(r2) where n(r2) represents noise in measured data at point r2.

Solve the vector-matrix equation g(r2)=H(r1,r2) f(r1)+n(r2) and estimate a solution f1(r1) for the 3D image f(r1) using a method that reduces the effect of noise n(r2) so that estimated solution f1(r1) is close to desired solution f(r1). Solution may be obtained through computations in the Fourier domain or the spatial domain. This step localizes y and z coordinates.

FIG. 6

Apply a polarizing magnetic field p(r1) for a short time period (e.g. 0.5 second) in volume V1 occupied by an object to be imaged. This results in the magnetization of the material in the object with magnetic dipole intensity f(r1). The magnetized object generates a magnetic field g(r2) around the object. Turn off p(r1).

A pulse of readout or measurement magnetic field Bm(r) is applied as in MRI. This field Bm(r) is applied perpendicular to the original polarizing magnetic field p(r). Simultaneously while applying Bm(r), two pulses, one a frequency encoding gradient magnetic field Gx along the x-axis, another a phase encoding gradient magnetic field Gy along the y-axis, are applied. The readout field Bm(r) is reversed so as to generate a radio frequency gradient echo signal. [Optional step: simultaneously with Bm(r), reverse Gx also.] Then measure g(r2,k(t)) at a set of points r2 in a 3D volume space V2 that in particular extends substantially along the radial direction pointing away from the center of the object. At each point r2, measure along at least one and possibly more directions.

Determine a system matrix H(r1,r2) which specifies magnetic field intensity characteristics at any point r2 produced by a magnetic dipole source of unit strength located at any other point r1. This system matrix H(r1,r2) is determined based on magnetic field propagation characteristics from a magnetic dipole, as well as magnetic field measurement apparatus characteristics such as direction, dimensions, and geometry of magnetic flux sensor elements..

Decode both frequency and phase using a 2D Fourier transform of g(r2,k(t)) to obtain modified g(r2). This localizes both x and y coordnates. Set up a vector-matrix equation g(r2)=H(r1,r2) f(r1)+n(r2) where n(r2) represents noise in measured data at point r2.

Solve the vector-matrix equation g(r2)=H(r1,r2) f(r1)+n(r2) and estimate a solution f1(r1) for the 3D image f(r1) using a method that reduces the effect of noise n(r2) so that estimated solution f1(r1) is close to desired solution f(r1). Solution may be obtained through computations in the Fourier domain or the spatial domain. This step localizes the z coordinate.

FIG. 7

METHODS AND APPARATUSES FOR 3D MAGNETIC DENSITY IMAGING AND MAGNETIC RESONANCE IMAGING

1. FIELD OF INVENTION

Magnetic Density Imaging (MDI) is a novel imaging technique related to Magnetic Resonance Imaging (MRI). It is based on the new Field Paradigm for 3D medical imaging proposed recently by the author of this invention. MDI provides images of objects similar to those provided by Magnetic Resonance Imaging (MRI) in prior art.

An object to be imaged by MDI is first subjected to a known polarizing magnetic field at each point for a short time duration of the order of around 0.00001 to 100.0 second (comparable to T1 relaxation time). This causes the nuclei in the small volume elements or voxels of the object to be magnetically polarized into small dipoles in the direction of the original polarizing magnetic field. The magnitude of polarization of each volume element is linearly related to the density of nuclear magnetic dipoles such as Hydrogen nuclei. The 3D spatial distribution of the magnetic vector field produced by the polarized object is then measured in a 3D volume space that extends in all directions including, in particular, substantially along the radial direction pointing outward from the center of the object. The magnetic vector field may also be measured along multiple directions. This measured data is used to invert the forward field formation process to reconstruct the 3D images of the object that provides properties of the object at each voxel. Properties include the density of magnetized nuclei, and the T1 and T2 contrast images in MRI related to magnetic relaxation parameters. In this scheme based on Field Paradigm, spatial locations of voxel dipoles are encoded by the spatial locations themselves. No separate spatial location encoding with frequency or phase as in traditional MRI is needed. However, MDI can be combined with frequency, phase, and other encoding techniques of MRI for achieving different trade-offs in different applications. In particular, MDI can be naturally combined with ultra-low field (ULF) MRI where the magnetic field strength is around the order of the earth's natural magnetic field (50 micro Tesla). Such combined MDI-MRI methods are also described here. Many variations of MDI are also disclosed. MDI can work with a wide range of polarizing magnetic field strengths, typically in the range of 1 micro-tesla to 10 Tesla range, as well as outside this range.

2. BACKGROUND

Traditional MRI is an important 3D medical imaging modality used for soft-tissue imaging in medical diagnosis. The primary problem with MRI is the slow scanning time, and in MRI with high magnetic fields, the presence of high magnetic fields introduces many problems. Scanning of a 3D object is done using slice-selection along the Z-axis based on Radio Frequency (RF) pulse with a particular frequency, and frequency encoding of voxel positions along the x-axis, and phase-encoding along the y-axis. In the case of Ultra-Low Field (ULF) MRI where the field strengths are in micro-Tesla range comparable to the earth's magnetic field, RF pulses need not be used. Position along the x-axis is encoded by frequency and phase encoding is used along both the y-axis and the z-axis. In parallel MRI (pMRI) schemes such as SENSE, SMASH, and GRAPPA, partial parallelism is achieved with RF sensor coils having different spatial sensitivities.

MDI can be combined with MRI, particularly ultra-low field (ULF) MRI to provide both T1 and T2 weighted images with a scanning time that is much less than MRI in prior art. ULF magnetic fields are measured using highly sensitive devices such as Superconducting Quantum Interference Devices (SQUIDS) or atomic magnetometers. Using such measured data, one can reconstruct a 3D image of the magnetic dipole patterns in an object such as soft tissue in a human body. More recently, ULF MRI has been demonstrated to be effective for security screening of passengers at airports, particularly for detecting explosive liquids hidden inside clothes of passengers.

This invention discloses methods and apparatuses for 3D imaging of objects based on Field Paradigm (FP) proposed recently by the author of this invention. Field Paradigm is a novel unified framework for several 3D medical imaging modalities including MRI and MDI. It is based on the Field Image Principle (FIP) stated as "the field intensity distribution in a 3D volume space uniquely determines the 3D density distribution of the field emission source and vice versa". This principle has not been realized, recognized, or exploited in the past in 3D medical imaging. Theoretical soundness of this principle is easily verified. Experimental verification has been done on rudimentary cases through computer simulation.

Field Image Tomography (FIT) is a theoretical framework based on Field Paradigm that provides computational algorithms for reconstructing 3D density distribution of field emission sources from the measured 3D field image data. In MDI magnetic dipoles in voxels act as sources of magnetic field in a 3D volume space. In MRI the magnetic dipoles similar to those in MDI are present. Each dipole is the vector sum of the magnetic moments of a large number of nuclei processing at Larmor frequency. In the beginning, these nuclei have random phases and therefore the total magnetic moment will be along the polarizing magnetic field. In MRI, these nuclei are made to spin in-phase using an RF pulse or a readout or measurement magnetic field Bm applied perpendicular to the polarizing magnetic field (after the polarizing field is turned off). Therefore the total magnetic moment vector will precess at the Larmor frequency. This results in a transverse time-varying magnetic flux that induces electric current in a measuring induction coil or a SQUID sensor. It is also possible to measure and use flux intensity instead of rate of change of flux with time for imaging.

Field Image Tomography, unlike techniques in prior art, is information-efficient in the sense that it exploits all available information that is useful for 3D image reconstruction. It is based on measuring field flux in a 3D volume space along multiple different directions instead of measurements on a 2D surface along a single direction at nearly fixed radial distance from the field emission source. In particular, field intensity produced by a small emission source decays with radial distance, and this characteristic of field propagation in a 3D volume space is exploited to determine the 3D density distribution of an emission source. Also, at each point, field intensity may be measured along multiple directions at each point for optimal image reconstruction results. A trade-off may be possible between the extent or length of the radial direction where measurements are made and the number of different directions along which measurements are made.

The data measured in the present invention captures all the available information and facilitates a computationally efficient solution to the 3D image reconstruction problem. This is unlike prior art where measurements are made only on a surface at a nearly constant radial distance from the center of the target object, and along a single direction. Therefore useful, and available data is ignored and not measured in prior art leading to suboptimal and inefficient (in terms of information usage) methods and apparatuses.

The magnetic dipole density distribution in both MDI and ULF MRI produce a magnetic field that is measured by high-sensitivity sensors such as SQUIDS (Superconducting Quantum Interference Devices) or atomic magnetometers. The measured values of the magnetic field intensity or its spatial derivatives are used to compute the 3D image of the dipole density distribution. This 3D image is useful in the diagnosis of many ailments. Magnetic fields are preferable in medical imaging in comparison with X-rays because magnetic fields are harmless and pass through body tissue and bones without much attenuation and distortion. The present invention provides methods and apparatuses for 3D imaging of soft tissue that are significantly faster than current MRI techniques.

The methods and apparatuses in prior art rely solely on data measured roughly on a surface and therefore they do not fully exploit all the available information. They ignore additional information available in the variation of magnetic field intensity with radial distance and along different directions in a 3D volume space around a target object.

This invention is based on measuring the magnetic field in an extended 3D volume space, not just on a surface at a nearly constant radial distance from the target object as in prior art. Magnetic field intensity measurements (or its derivatives) are made in a 3D volume space that extends substantially along the radial direction from the center of the target object. Further, magnetic field intensity measurement at each point may be made along multiple directions. This has the effect of measuring a 3D vector field in a 3D space at different distances and along different directions at each point. This type of measurement effectively captures almost all available information that is useful in 3D image reconstruction.

Field Paradigm has been applied recently by the author of this invention to 3D medical imaging in four other cases: Single-Photon Emission Computed Tomography (SPECT), high-field (0.01 to 10 Tesla) Magnetic Resonance Imaging (MRI), Magnetoencephalography (MEG) and Magnetocardiography (MCG). A detailed description of these applications are provided in the following U.S. patent applications filed by the author of this invention recently:
1. M. Subbarao, "Method and apparatus for high-sensitivity Single-Photon Emission Computed Tomography", U.S. patent application Ser. No. 12/586,863, Date Sep. 29, 2009.
2 M. Subbarao, "Field Image Tomography for Magnetic Resonance Imaging", U.S. patent application Ser. No. 12/658,001, Date Feb. 1, 2010.
3. Methods and apparatuses for 3D Imaging in Magnetoencephalography and Magnetocardiography, U.S. patent application Ser. No. 12/924,959, Date Oct. 9, 2010.

The contents of the three patent applications listed above and the following published papers on Ultra Low-field MRI and Magnetic Polarization Imaging (MPI) in their entirety are incorporated herein by reference:
1. V. S. Zotev, A. N. Matlashov, P. L. Volegov, I. M. Savukov, M. A. Espy, J. C. Mosher, J. J. Gomez, R. H. Kraus Jr., "Microtesla MRI of the human brain combined with MEG", Journal of Magnetic Resonance, 194 (2008) 115-120.
2. J. O. Nieminen, M. Burghoff, L. Trahms, R. J. Ilmoniemi, "Polarization encoding as a novel approach to MRI", Journal of Magnetic Resonance 202 (2010) 211-216.

The prior art described in the above two papers and the references therein do not use a method that involves measuring magnetic field data in a 3D volume space that extends substantially along the radial direction, nor do they describe an apparatus that has a means for measuring the magnetic field around an object in a 3D volume space that extends substantially along the radial direction. In addition, the methods and apparatuses disclosed in these and other related papers always use frequency encoding, phase encoding, or polarization encoding. MDI does not require any such encoding but it can be combined with those encoding schemes for various trade-offs such as speed of imaging and number of sensor elements to measure magnetic fields. Therefore, as explained earlier, the methods and apparatuses in the above 2 papers and related papers suffer from many disadvantages such as being slow and less accurate as they do not measure all available information that is useful in 3D imaging.

3. OBJECTS AND ADVANTAGES

It is an object of the present invention to provide methods and apparatuses for 3D imaging in any object including a biological tissue based on the magnetization properties of the tissue when subjected to an external polarizing magnetic field. It is another object of the present invention to provide a faster, cheaper, and a better alternative to standard MRI and ULF MRI by reducing or entirely avoiding the dependence on frequency encoding, phase encoding, and/or polarization encoding schemes (which make imaging slow) for spatial localization of magnetic dipole elements. A faster imaging method and apparatus are very important for patient comfort and for the imaging of moving organs such as the human heart. The methods and apparatuses of the present invention can be combined with current MRI and magnetic polarization methods and apparatuses to accomplish different trade-offs between imaging speed, number of sensor elements, magnetic field strength, and spatial resolution.

An advantage of the present invention is that it is information efficient, i.e. it measures and exploits all available information for 3D image reconstruction. Therefore it provides a more accurate 3D image in terms of spatial, temporal, and contrast or intensity resolution and therefore it improves the accuracy of medical diagnosis leading to better treatment of patients.

A novel feature of this invention is the measurement of magnetic field pattern not just on a thin surface but in a 3D volume space that extends substantially along the radial direction in addition to two other mutually perpendicular directions. At each point in the 3D volume space, measurements could be made along multiple directions. The methods of the present invention processes this 3D volume data to reconstruct accurate 3D images.

4. SUMMARY OF THE INVENTION

The present invention provides methods and apparatuses for 3D imaging of an object including a biological tissue. It includes a method of reconstructing a 3D image $f(r1)$ that specifies a spatial density distribution of magnetic dipoles in an object in a 3D volume space V1 at each point r1. This method comprises the following steps:
(a) Applying a known polarizing magnetic field $p(r)$ for a short time period of about 0.00001 second to 100 seconds in the 3D volume space V1 occupied by the object. This $p(r)$ magnetically polarizes or magnetizes the object. The resulting magnetic dipole density distribution is represented by $f(r1)$ (or $M(r)$ in some equations). After a short period, this applied magnetic field $p(r)$ is turned off;
(b) Measuring at least one component of magnetic field intensity characteristics generated by magnetic dipoles in the object. This measurement is made in a 3D volume space V2 that in particular extends substantially along a radial direction pointing away from the approximate center of the object. The extension of the measurement volume space along the radial direction is unlike that in prior art and it facilitates capturing almost all available information for 3D image reconstruction. In particular, this captures information provided by the field decay along the radial direction which is not realized, recognized, or exploited in prior art. This measured data is recorded as a function of measurement position r2 in a 3D volume space V2 as g(r2) (also denoted by B(r) in some equations).

(c) Determining a system matrix H(r1,r2) that specifies magnetic field intensity characteristics at point r2 produced by a unit magnetic dipole located at point r1. This system matrix H(r1,r2) is determined based on magnetic field propagation characteristics from a magnetic dipole as well as magnetic field measurement apparatus characteristics. Magnetic field intensity characteristics can include both intensity values as well as its spatial and/or temporal derivatives.

(d) Setting up a vector-matrix equation g(r2)=H(r1,r2) f(r1)+n(r2) where n(r2) represents noise in measured data at point r2; and (e) Solving the vector-matrix equation g(r2)=H(r1,r2) f(r1)+n(r2) and estimating a solution f1(r1) for the 3D image f(r1) using a method that reduces the effect of noise n(r2) so that estimated solution f1(r1) is close to desired solution f(r1). By computing f1(r1) at short time intervals, not only the magnetic dipole density, but also T1 and T2 contrast images can be reconstructed.

In the above method, Step (a) and Step (c) may include additional substeps with Step (a) further including the following substeps:

1) after turning off polarizing magnetic field p(r), applying a pulse of readout or measurement magnetic field Bm(r) perpendicular to the original polarizing magnetic field p(r) and simultaneously applying another pulse of a frequency encoding gradient magnetic field Gx along a first axis or x-axis;

2) reversing Bm(r) so as to generate a radio frequency gradient echo signal; and Step (c) further including the substep of frequency decoding and phase decoding of any frequency and phase encoded time dependent data in measured data. This decoding step is carried-out through a Fourier transformation of measured data to obtain modified g(r2). The steps of frequency encoding and decoding as well as phase encoding and decoding are all standard techniques in MRI and ULF MRI. Therefore techniques will not be described in full details here.

In the method above, substep (1) may further include the following additional substep: applying a phase encoding gradient magnetic field Gy along a second axis or y-axis perpendicular to the first axis or x-axis.

In the method above, substep (2) may further include the following additional substep: simultaneously with the reversal of Bm(r), also reversing Gx.

The object or the biological tissue in the above method can be that of an animal, mammal, or human. It can be the brain or the heart or any soft-tissue organ, or any magnetizable object such as water. In this method, the measured magnetic field characteristics can include the spatial and/or temporal derivatives of the magnetic filed. Measuring spatial derivatives of magnetic field intensity instead of actual intensity eliminates the effects of the background magnetic field of the earth.

In the above method, the vector-matrix equation g(r2)=H(r1,r2) f(r1)+n(r2) may involve the convolution of H(r1,r2) and f(r1). In that case, Step (e) above is carried-out in the Fourier domain by computing the Fourier transforms of g(r2), and H(r1,r2), and M0) is computed using inverse Fourier transform and inverse filtering in the Fourier domain.

The present invention includes an apparatus for measuring magnetic field intensity characteristics around an object enclosed in a 3D volume space V1. This apparatus comprises a means for magnetically polarizing the object with a known polarizing magnetic field p(r) to induce a magnetic dipole density distribution f(r1) in the object. The apparatus further includes a means for measuring and recording magnetic field intensity characteristics of magnetic fields generated by the magnetic dipole density distribution f(r1) induced in the object. The magnetic dipole density in the object will have a 3D spatial density distribution of f(r1). This means for measuring magnetic field intensity characteristics must specifically be capable of measuring at a set of points r2 in a 3D volume space V2. This volume space V2 in particular must extend substantially along the radial direction pointing away from the approximate center of the object. The measured data is recorded as a function of position r2 of points in the 3D volume space V2 as g(r2).

The apparatus above can further include a means for applying a readout or measurement magnetic field Bm(r) perpendicular to the original polarizing field p(r), and another frequency encoding gradient magnetic field Gx perpendicular to Bm(r). It may further include a means for applying a phase encoding gradient magnetic field Gy perpendicular to both Gx and Bm(r). It may also include means for reversing the direction of Bm(r) alone or both Bm(r) and Gx.

In the above apparatus, the means for measuring magnetic field characteristics can be an array of SQUIDS (superconducting quantum interference devices), atomic magnetometer, a radio frequency sensor coil, or any magnetic field measurement device.

The apparatus described above may further include the following components:

(a) A means such as a digital computer for setting up a vector-matrix equation of type g(r2)=H(r1,r2) f(r1)+n(r2) where H(r1,r2) represents a system matrix. This matrix H(r1,r2) specifies magnetic field intensity at point r2 produced by a magnetic dipole of unit strength located at point r1. Here n(r2) represents noise in measured data at point r2.

(b) A means for solving the vector-matrix equation g(r2)=H(r1,r2) f(r1)+n(r2) and estimating a solution f1(r1) for the 3D image f(r1) using a method that reduces the effect of noise n(r2) so that estimated solution f1(r1) is close to desired solution f(r1). By computing f(r1) at short time intervals, not only the magnetic dipole density, but also T1 and T2 contrast images can be reconstructed.

In the apparatus described above, the means for solving the vector-matrix equation g(r2)=H(r1,r2) f(r1)+n(r2) can further include a means for computing Discrete Fourier Transforms (DFT) and inverse filtering. This means is used for solving the vector-matrix equation g(r2)=H(r1,r2) f(r1)+n(r2) in the Fourier domain.

The apparatus above can be made in a shape suitable for the case when the object or the biological tissue is a brain being imaged. It can also be made in a shape suitable for the case when the biological tissue is a heart. The apparatus can further include a digital computer and a display monitor for displaying images.

5. BRIEF DESCRIPTION OF DRAWING

FIG. 1 shows a certain embodiment of the apparatus of the present invention. A 3D array of magnetic field measurement sensors 101 is provided. This sensor array contains a large number of small sensor elements such as SQUIDS distributed in a 3D volume space. At each point, the sensor elements in the 3D array can measure the magnetic field intensity or its spatial derivatives along at least one and possibly many different directions. Note that a single sensor element can be rotated around different axes by different angles to measure the magnetic field intensity characteristics along many different directions. This sensor array has a shape such that it surrounds the object such as a biological tissue, or the human brain or heart, that needs to be imaged. In particular, unlike prior art, the sensor elements are distributed along all directions including substantially along the radial direction 105 that points away from the center of the object of study. In prior art, the sensor elements are typically restricted to lie on a 2D surface that covers the object of study but the surface itself is thin along the radial direction 105 and so the sensor elements are not distributed along the radial direction. This is a critical and distinguishing feature of the present invention because it is the distribution of the sensors along the radial direction 105 that captures the additional information necessary for 3D image reconstruction of magnetic dipole density in the object. The biological object 102 is shown to be surrounded by the 3D sensor array. This object can be any biological object such as an animal tissue or any magnetizable object such as water. The 3D sensor array is connected to computer 103 for processing measured data. The computer 103 is also connected to a display device 104 such as a computer monitor for displaying the reconstructed 3D images for viewing by humans. Electrical coils that produce gradient magnetic fields Gx and Gy are 106 and 107 respectively. Similar coils but along the z-axis are used to produce the readout magnetic field Bm(r), but these coils are not shown in FIG. 1 due to clutter. Also, coils for producing the polarization field p(r) are not shown, but they can along the y-axis similar to 107.

Figure 2:
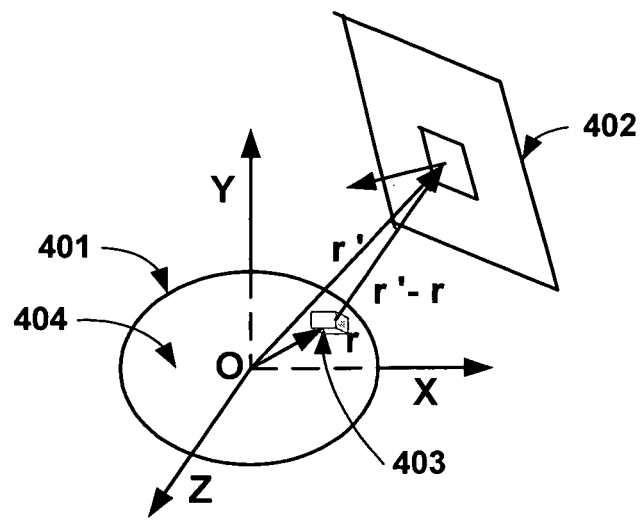

FIG. 2 shows the geometry of the field emission source element (magnetic dipoles) or an object voxel 403 at position r, magnetic field measurement sensor 402, one element of magnetic field sensor at position r', field emission source object such as a biological object 401, and volume 404 in which the field emission source is distributed.

Figure 3:
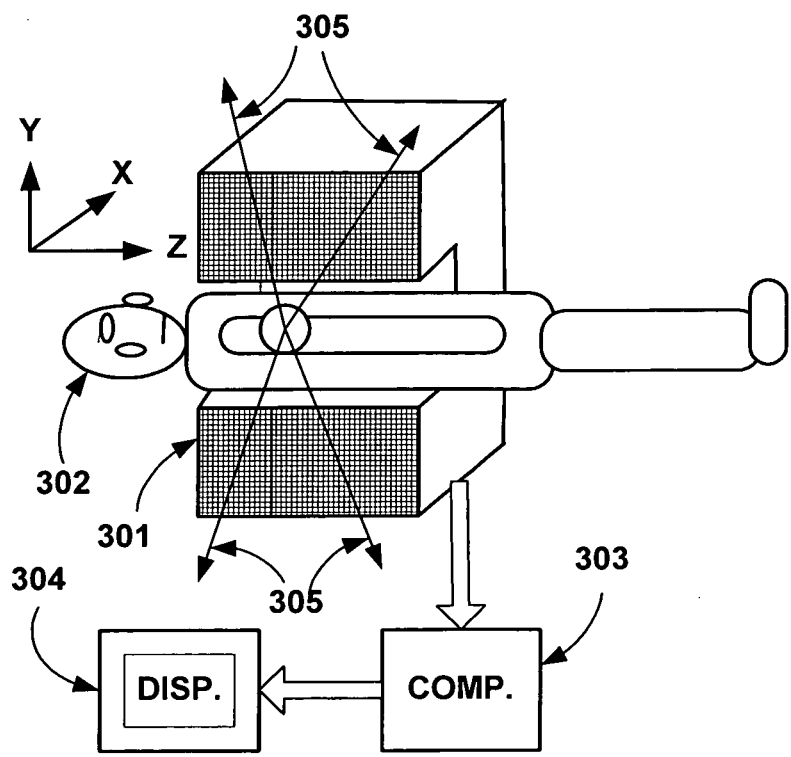

FIG. 3 shows a certain embodiment of the apparatus of the present invention. This Figure is similar to FIG. 1 but the object in this case is the human chest for imaging the heart. A 3D array of magnetic field measurement sensors 301 is provided. This sensor array contains a large number of small sensor elements such as SQUIDS distributed in a 3D volume space that extends substantially along the radial direction 305. These sensor elements may also be capable of measuring the magnetic field intensity characteristics along multiple directions at each point. The biological object 302 is shown to be surrounded by the 3D sensor array. The 3D sensor array is connected to computer 303 for processing measured data. The computer 303 is also connected to a display device 304 such as a computer monitor for displaying the reconstructed 3D images for viewing by humans. Means for producing magnetic fields are not shown in the FIG. 3, but they are present in the apparatus.

Figure 4:
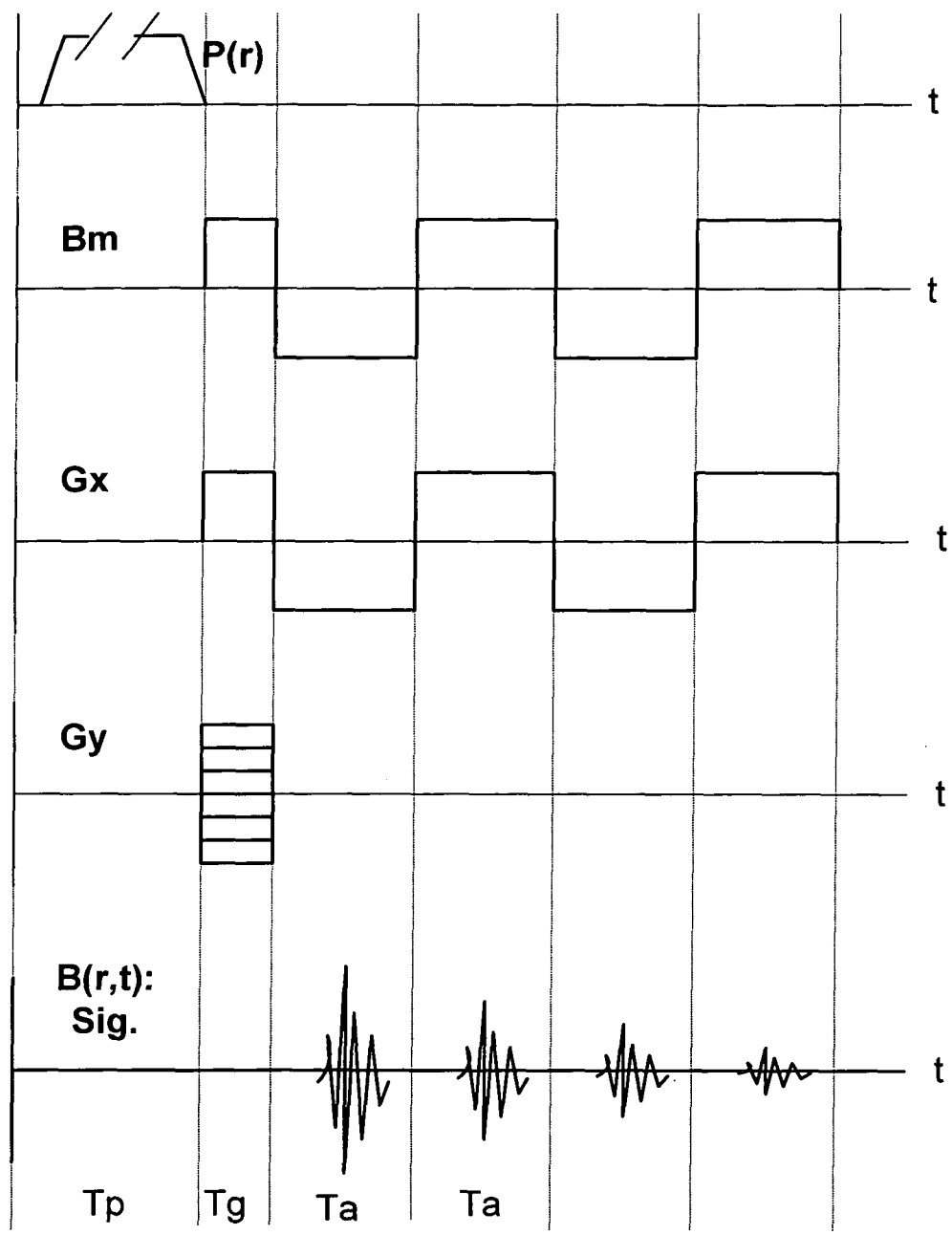

FIG. 4 shows a schematic timing diagram of magnetic pulses used in the methods and apparatuses of the present invention. P(r) is the polarization pulse applied for about Tp=1.0 Second. One possible value of P(r) could be around 0.030 Tesla, about one fiftieth of a standard 1.5 Tesla MRI. Bm (around 50 micro Tesla) is the readout or measurement magnetic field, and Gx and Gy (each around 100 micro Tesla per meter) are gradient pulses that respectively encode frequency and phase. Bm and Gx are applied repeatedly with a time period of Ta (e.g. around 50 ms). Gy pulse is applied for a time period of Tg (e.g. around 25 ms). B(r,t) is the time-dependent signal that is measured by magnetic field sensors. Fourier transforming this signal with respect to time in k-space, frequency and phase are decoded to localize x and y coordinates to obtain $g(r2)=B(r2)$. Then the equation $g(r2)=H(r1,r2) f(r1)+n(r2)$ is set up and solved to obtain the 3D image $f(r1)$ which localizes the z-coordinate of magnetic dipole elements. The pulse Gy can be skipped to avoid phase encoding. In this case, Fourier transform of the signal B(r,t) localizes only the x-coordinate, and solving the equation $g(r2)=H(r1,r2) f(r1)+n(r2)$ localizes both the y and z coordinates. In this latter case, measurements will have to be made at about 50 times more points r2 than in the previous case. Therefore, the number of magnetic field sensors needed will be proportionately more.

FIG. 5 shows a flow-chart of the first method of the present invention corresponding to pure MDI. In this method, no frequency encoding or phase encoding are used and therefore no gradient magnetic fields such as Gx and/or Gy are used.

FIG. 6 shows a flow-chart of the second method of the present invention. Here MDI is combined with frequency encoding MRI. In this method, MDI localizes y and z coordinates of magnetic dipoles while MRI localizes the x-coordinate. In this method, no phase encoding is used and therefore the gradient magnetic field Gy is not used.

FIG. 7 shows a flow-chart of the third method of the present invention. Here MDI is combined with both frequency encoding using Gx and phase encoding using Gy with MRI. In this method, MDI localizes the z coordinate of magnetic dipoles while MRI localizes the x-coordinate through frequency encoding, and y-coordinate through phase encoding. In this method, both the gradient magnetic fields Gx and Gy are used.

6. DESCRIPTION OF THE INVENTION

This invention discloses novel methods and apparatuses for 3D imaging of any magnetizable object such as soft-tissue. A detailed description of the methods and apparatuses are presented in this section.

The present invention is based on a new theory not found in prior art. It is based on the Field Paradigm. Therefore, the theoretical basis of the present invention is presented with concrete mathematical derivations for 3D imaging in MDI and MRI.

Magnetic Density Imaging (MDI) is a novel imaging technique related to Magnetic Resonance Imaging (MRI) but without necessarily exploiting magnetic resonance characteristics of objects. MDI provides images of objects similar to those provided by MRI in prior art. An object to be imaged by MDI is first subjected to a known polarizing magnetic field at each point for a short time duration of the order of around 0.00001 to 100.0 second (comparable to the T1 relaxation time of the target object). This causes the small volume elements or voxels of the object to be magnetically polarized or magnetized into small dipoles in the direction of the original polarizing magnetic field. The magnitude of polarization of each volume element depends on the density of nuclear magnetic dipoles such as Hydrogen nuclei in the volume element. The 3D spatial distribution of the magnetic vector field produced by the polarized object is then measured in a 3D volume space. This space extends in all directions including, in particular, substantially along the radial direction pointing outward from the center of the object. This measured data is used to invert the forward field formation process to reconstruct the 3D images of the object. The magnitude of magnetization density can be measured by removing the polarizing field, and then applying a readout or measurement field Bm perpendicular to the original polarizing field. After this, the magnetic field generated by magnetized voxels of the object is measured. This measurement is made in a 3D volume space around the object, and at least along one direction and possibly along multiple directions.

In this scheme spatial locations of voxel dipoles are encoded by the spatial locations themselves. Unlike traditional MRI, no separate spatial location encoding is needed with frequency or phase. Also no Radio Frequency pulses are needed for flipping magnetic moments. However, MDI can be combined with frequency, phase, and other encoding techniques of MRI for achieving different trade-offs in different applications. Many variations of MDI where it is combined with frequency and/or phase encoding techniques of MRI are possible and they are described here. MDI can work with a wide range of polarizing magnetic field strengths, from around 1 micro-tesla to 10 Tesla range.

In MDI, a magnetic polarizing vector field p(r) is applied to the target object to be imaged for a short period comparable to the T1 time (relaxation time in MRI) which could be 0.00001 to 100 seconds. This causes the material in the object to be magnetically polarized. Let this polarized field be m(r). The polarizing field p(r) should be applied for a sufficient time period so that m(r) is comparable to the polarization level at saturation. The direction of m(r) at each voxel will be the same as the direction of p(r) and the magnitude of m(r) will be monotonically (mostly linearly) related to the magnitude of p(r). The rate at which polarization reaches saturation with time when p(r) is first applied and also the rate at which the polarization decays after p(r) is removed could provide information on the material properties of the object such as T1 and T2 parameters. This rate could be measured by applying or measuring the magnetic field at different time intervals and MDI could be used to reconstruct 3D images of T1 and/or T2 contrast images.

In both regular MRI and the Micro-tesla or ultra-low field (ULF) MRI, the magnetic dipole moment vector field m(r) is made to precess in a readout or measurement magnetic field $B_m$. This $B_m$ is applied perpendicular to the original polarizing field p(r). Then the dipoles in different voxels are encoded with different precession frequency and phase using magnetic gradient pulses or Radio Frequency (RF) pulses, and resulting time varying signals are measured by an RF coil or a SQUID (Super-conducting Quantum Interference Devices). In pure MDI, m(r) is measured directly without using RF pulses and gradient magnetic fields. In mixed MDI-MRI, frequency, phase, and other types of encoding steps are combined with MDI for spatial encoding along different directions.

In pure MDI, the problem is to determine the magnitude M(r) (also denoted by f(r1) later) of m(r) given its direction at each voxel. In order to determine M(r) at each voxel inside the object, magnetic field B(e) (also denoted by g(r2) later) due to the presence of m(r) is measured in a 3D volume space outside the object at a large set of points r'.

Consider an object to be imaged with biological tissue. For example, this object could be a brain or a heart. The case of a human brain imaging apparatus is shown in FIG. 1. This object 102 occupies a certain 3D volume space V1 inside a cubical volume, say with an approximate dimension of 200 mm on each side. In FIG. 2, the object is shown as 401 and volume V1 is shown as 404. This cubical volume can be thought of as being made up of small cubic volume elements or voxels of dimensions 1 mm on each side. In general, the length, width, and height of such voxels can be specified as dx, dy, dz along x, y, and z axes, at each point. The position of any voxel occupied by the object with coordinates (x,y,z) is specified by a 3D position vector r and the unit vectors i,j,k, along x,y,z, axes respectively as $$r=ix+jy+kz. \quad (1)$$

For example, see FIG. 2 where the voxel 403 and its position r are shown. Let the magnetic dipole in each voxel be $$m(r)=kM(r). \quad (2)$$

Let the measured magnetic field B(e) at a point r' be represented by a 3D vector with unit vectors i, j, k, along the x,y, and z axes respectively by $$B(r')=iB_x(r')+jB_y(r')+kB_3(r') \quad (3)$$

and $$r'=ix'+jy'+kz'. \quad (4)$$

See FIG. 2 which shows r' and the sensor 402 for measuring the magnetic field. The problem in MDI is, given B(r') measured at a large number of points r' spread out along all dimensions in a 3D volume space, and measured along at least one and possibly many directions, estimate the 3D dipole density function M(r). According to basic physics, the magnetic field $dB_1(e)$ at r' due to the magnetic dipole density $$m(r) \quad (5)$$

in a single voxel of size or volume $$dV=dxdydz \quad (6)$$

at r is given by $$dB(r') = cM(r)dxdydz\frac{1}{R^3}(3\hat{r}[\hat{r}\cdot\hat{m}(r)] - \hat{m}(r)) \quad (7)$$

$$R = |r' - r| \quad (8)$$

$$\hat{r} = \frac{r' - r}{|r' - r|} \quad (9)$$

$$M(r)=|m(r)| \quad (10)$$

$$\hat{m}(r)=m(r)/|m(r)| \quad (11)$$

where constant c is related to the magnetic permeability constant $\mu_0$ as $$c = \left(\frac{\mu_0}{4\pi}\right). \quad (12)$$

It should be pointed out that the magnetic dipole moment m(r)dV of a single voxel at r is the vector sum of a large number of dipole moments along different directions, each one due to a single atomic nucleus. In the above equations M(r)=|m(r)| is the only unknown. All other quantities including $\hat{m}(r)=m(r)/|m(r)|$ are known. In particular, if $\hat{m}(r)=m(r)/|m(r)|$ is a constant unit vector that does not vary with r, then a convolution equation will result later instead of a more computationally intensive integral equation. $\hat{m}(r)$ is a unit vector which is along the same direction as the direction of magnetic polarization p(r).

The total magnetic field due to magnetic dipoles in all the object voxels is given by the linear superposition of the field due to each of them. This results in the volume integral $$B(r') = \int_V H(r', r) M(r) dV \quad (13)$$

where $$H(r', r) = \frac{c}{R^3}(3\hat{r}[\hat{r}\cdot\hat{m}(r)] - \hat{m}(r)) \quad (14)$$

$$H_x(r',r) = \Box H(r',r) \quad (15)$$

$$H_y(r',r) = j\Box H(r',r) \quad (16)$$

$$H_z(r',r) = k\Box H(r',r) \quad (17)$$

If $\hat{m}(r)$ is a known constant, then the above equation can be written as $$B(r') = \int_V H(r' - r) M(r) dV \quad (18)$$

The above vector equation is equivalent to three scalar equations, one for each of the components along the x,y, and z, axes. The above equation can be written for a single component along some unit vector n by taking the dot product with respect to n on both sides as $$n \Box B(r') = \int_V n \Box H(r' - r) M(r) dV \quad (19)$$

$$i \Box B(r') = B_x(r') = \int_V H_x(r' - r) M(r) dV \quad (20)$$

$$j \Box B(r') = B_y(r') = \int_V H_y(r' - r) M(r) dV \quad (21)$$

$$k \Box B(r') = B_z(r') = \int_V H_z(r' - r) M(r) dV \quad (22)$$

which is a convolution equation. By measuring any one component of B(r'), we can solve for M(r), but additional components can be used for reducing too many measurements along the radial direction and also for suppressing noise in measurements. In the case of convolution, the solution can be obtained efficiently in the Fourier domain using the FFT algorithm.

These measurements are made at a large number of points r' (or r2) distributed in a 3D volume space V2, at least along one direction and possibly along multiple directions. These measured values are related to the unknown M(r) and the point spread function H(r'-r) by Equation (18) These equations have the form of a convolution expression which can be solved. For example, let the respective Fourier transforms be represented by lower case letters. Then we obtain, $$u = (u_x, u_y, u_z) \quad (23)$$

which denotes the spatial Fourier frequencies. Further Eqns. (20) to (22) have the following equivalent equations in the Fourier domain:

$$b_x(u) = h_x(u) m(u) \quad (24)$$

$$b_y(u) = h_y(u) m(u) \quad (25)$$

$$b_z(u) = h_z(u) m(u) \quad (26)$$

The solution of course is $$m(u) = b_x(u)/h_x(u) = b_y(u)/h_y(u) = b_z(u)/h_z(u) = b_n(u)/h_n(u) \quad (27)$$

and $$M(r) = F^{-1}\{m(u)\} \quad (28).$$

where $F^{-1}\{m(u)\}$ is the inverse Fourier transform of m(u). Thus Eq. (28) provides a closed-form solution in the Fourier domain. Having measured one or more components of B(r'), the solution for the 3D image reconstruction problem is computed using Eqns. (27) and (28). These equations (18) to (28) in fact constitute a theoretical proof of the existence of the unique solution and a proof of the Field Image Principle. Once the existence of a unique solution is established as done here, either Fourier or spatial domain techniques may be used to solve the problem.

Unlike MRI, MDI does not involve sequential scanning for different 2D slices of the object through RF pulses, and scanning different rows in slices through phase-encoding. Frequency encoding along one-dimension can be used along with MDI to avoid sequential scanning for phase encoding and obtain a very fast 3D imaging technique.

MDI can be combined with conventional MRI or Ultra-low field MRI by using spatial encoding with frequency and phase for one or two dimensions and using MDI equations to localize the sources along the remaining one or two dimensions. MDI can also be extended by varying the time duration (less than the time for saturation) of application of the polarizing field p(r) and then measuring the level of polarization at different time intervals. Measurements can also be made by varying both the spatial and temporal distribution of p(r) and solving for M(r) with different p(r) to obtain different material properties (e.g. T1 and T2 contrasts in MRI) of the object being imaged.

It is also possible to compute a solution in the spatial domain by writing equations in the discrete spatial domain that are equivalent to Eq. (18) or Eqns. (19) to (22). In this case one obtains a large system of linear equations expressed as a vector matrix equation of the form $$g(r') = H(r',r) f(r) + n(r') \quad (29)$$

or, setting r1=r and r2=r', Eq. (29) becomes $$g(r2) = H(r1, r2) f(r1) + n(r2) \quad (30).$$

In Eqs. (29) and (30), g(r') and g(r2) denote a column vector of measured magnetic field intensity data or derivatives of the intensity corresponding to B(r'); H(r',r) and H(r1,r2) denote a system matrix related to the point spread function (e.g. see in Eq. (14)). f(r) and f(r1) denote a column vector of unknown dipole density distribution corresponding to M(r) in Eq. (18) that needs to be solved for; and, n(r') and n(r2) denote noise in the measured data. The system matrix H(r1,r2) is affected by sensor characteristics and geometry. Eq. (30) can be solved using any one of many available techniques in the literature. This solution is carried out in a computer 103 shown in FIG. 1, and then the reconstructed 3D image f(r1) is displayed on a computer monitor or display 104.

A regularized inverse filter such as a Weiner filter or a spectral filter can be used for computing f(r1) using Equation (27) or (30).

Although Equation (18) provides a solution, in practice, due to the interference of the Earth's magnetic field with the magnetic field produced by magnetized voxels of the object, a minor change can be made. The effect of Earth's magnetic field can be cancelled by applying an opposing or a cancelling magnetic field, or by measuring spatial derivatives of B(r') in Equations (18) to (22) instead of just B(r') and specified by its components. SQUIDS (Superconducting Quantum Interference Devices) can directly measure such spatial derivatives of magnetic fields.

For example, the following equations can be used instead of Eqs. (19):

$$n \square \frac{\partial}{\partial x'} B(r') = \int_V n \square \frac{\partial}{\partial x'} H(r'-r) M(r) dV \qquad (31)$$

$$n \square \frac{\partial}{\partial y'} B(r') = \int_V n \square \frac{\partial}{\partial y'} H(r'-r) M(r) dV \qquad (32)$$

$$n \square \frac{\partial}{\partial z'} B(r') = \int_V n \square \frac{\partial}{\partial z'} H(r'-r) M(r) dV \qquad (33)$$

The above equations can be solved in the Fourier domain or spatial domain by writing them in the form g(r2)=H(r1,r2) f(r1)+n(r2).

6.1 Combining MDI with Frequency and Phase Encoding MRI

MDI described above localizes or determines the spatial coordinates of magnetic dipoles in a voxel in all 3 dimensions of (x,y,z). In this case, the number of points r2 where the magnetic field g(r2) has to be measured is at least equal to the total number of voxels in the object of interest. This number could be very large say 1000 to 1,000,000. In order to reduce this number by a factor of 10 to 100,000, MDI could be combined with a standard MRI technique where localization is done with frequency encoding along one axis and phase encoding along one or two other axes. Slice selection of a slice perpendicular to one of the axis based on a gradient magnetic field along the axis and a corresponding resonant Radio Frequency (RF) pulse can also be used for localization along one of the axis, An important advantage of MDI is that it is parallel and faster than phase encoding and sequential slice scanning and selection with RF pulses. There is a trade-off between the number of points r2 where g(r2) should be measured and imaging speed when MDI is combined with frequency and/or phase encoding techniques for partial localization. As an example, MDI can be used to localize along z-axis while frequency and phase encoding can be used to localize along x and y axes. Another alternative is to localize along x-axis with frequency encoding and along y and z axes with MDI. Other combinations are possible including the case where MDI is just used to improve the spatial resolution of localization results of other encoding techniques.

When MDI is combined with frequency and phase encoding techniques, the combined equation can be expressed using the conventional notation in the usual k-space (note: use context to distinguish the notation for k in k-space from unit vector k along z axis) as $$B(k(t), r') = \int_V H(r'-r) M(r) e^{-t/T_2^*} e^{j2\pi(k(t) \square r)} dV \qquad (34)$$

Assuming $T_2^*$ for the object is relatively large compared to measurement time and gradient pulse durations, the above equation can be approximated as $$B(k(t), r') = \int_V H(r'-r) M(r) e^{j2\pi(k(t) \square r)} dV \qquad (35)$$

Considering only one component, say the x-component as an example, $$B_x(k(t), r') = \int_V H_x(r'-r) M(r) e^{j2\pi(k(t) \square r)} dV \qquad (36)$$

If k spans all 3 dimensions, i.e. one frequency encoding dimension and 2 phase encoding dimensions, we can use the inverse Fourier transform to obtain $$H_x(r'-r) M(r) = \int_{k(t)} B_x(k(t), r') e^{-j2\pi(k(t) \square r)} dk(t) \qquad (37)$$

Suppose that k spans only x and y dimensions but not the z dimension (i.e. $k_z=0$), then we obtain $$B'_x(r') = \int_Z H_x(r'-r) M(r) dz = \int_{k(t)} B_x(k(t), r') e^{-j2\pi(k(t) \square r)} dk(t) \qquad (38)$$

The equation above clarifies that when k does not span the z dimension, then integral with respect to z on the left can be deconvolved using MDI to obtain M(r), that is by measuring the magnetic field at a large number of points spread out along the z-axis in particular, in addition to the x and y axes as needed.

6.2 Apparatuses of the Invention

The present invention includes apparatuses for measuring magnetic field intensity characteristics around an object, e.g. a biological tissue, enclosed in a 3D volume space V1. These apparatuses could be used in applications such as MDI, MRI, and ULF MRI. A certain embodiment of this apparatus is shown in FIG. 1.

The apparatus includes a means 101 for measuring magnetic field intensity characteristics of magnetic fields. For example, it could be a 3D array of SQUIDS or RF coils or magentometers surrounding an object 102. It could also be a 2D array of SQUIDS or RF coils that is moved to cover a 3D volume space around the object and measure the magnetic field characteristics at different points in the 3D volume space. The sensor array 101 measures the magnetic field of the dipole elements in voxels of the object 102 such as an animal/human brain/heart. The dipole filed strength in the biological tissue can have a 3D spatial density distribution of f(r1). The sensor array for measuring magnetic field intensity characteristics must specifically be capable of measuring at a set of points r2 in a 3D volume space V2 around the biological object 102. This volume space V2 in particular extends substantially along the radial direction pointing away from the approximate center of the object. This is the key distinguishing feature of the apparatus of the present invention that is not found in prior art. This feature was not introduced in prior art as the field paradigm and the field image principle disclosed here were not known in prior art. This apparatus is further capable of recording measured data as a function of position r2 of points in the 3D volume space V2 as g(r2) corresponding to B(r). At each point r2 the magnetic vector field measurement is made along at least one direction (e.g. the radial direction) and possibly along multiple directions.

The apparatus described above may further include a means such as a digital computer 103 for setting up a vector-matrix equation of type $g(r2)=H(r1,r2) f(r1)+n(r2)$ where $H(r1,r2)$ represents a system matrix. This is typically a large linear system of equations where $g(r2)$ and $H(r1,r2)$ are known but $f(r1)$ is unknown. Noise $n(r2)$ is unknown but its statistical characteristics are known (e.g. it could be zero-mean Gaussian random noise with standard deviation σ). The matrix $H(r1,r2)$ specifies magnetic field intensity at point r2 produced by a magnetic dipole of unit strength located at point r1. Further, the term $n(r2)$ represents noise in measured data at point r2. The computer 103 is further provided with a software or hardware means for solving the vector-matrix equation $g(r2)=H(r1,r2) f(r1)+n(r2)$ and estimating a solution MO) for the 3D image $f(r1)$. This means for estimating the solution for $f(r1)$ is such that it reduces the effect of noise $n(r2)$ so that estimated solution $f1(r1)$ is close to desired solution $f(r1)$. Many standard systems are available for this purpose including those based on regularization.

In the apparatus described above, the means for solving the vector-matrix equation $g(r2)=H(r1,r2) f(r1)+n(r2)$ can further include a means for computing Discrete Fourier transforms and inverse filtering. This part can be used in solving the vector-matrix equation $g(r2)=H(r1,r2) f(r1)+n(r2)$ in the Fourier domain.

The apparatus above can be made in a shape suitable for different objects. For example, in the case of human brain, the sensor array 101 can have a shape suitable for enclosing a human head. It may take the shape of a very thick helmet. The apparatus can also have a shape suitable for surrounding a human chest for imaging the heart. In this case, shape and motion of heart tissue can be measured. The 3D sensor array in this case may have the shape of a thick cylinder.

6.3 Methods of the Invention

The present invention provides methods for 3D imaging of an object such as soft-tissue, brain, heart, etc, in MDI, MRI, and related applications. It includes a method of reconstructing a 3D image $f(r1)$ that specifies a spatial density distribution of nuclear dipoles in an object in a 3D volume space V1 at each point r1. This method comprises the following steps.

Step 1: A known polarizing magnetic field $p(r)$ is applied for a short time period of about 0.00001 second to 100 seconds in a 3D volume space V1 occupied by the object to be imaged. This field magnetically polarizes or magnetizes the material in the object with a magnetic dipole intensity given by $m(r)$ or $f(r1)$. The direction of $m(r)$ vector will be the same as the direction of $p(r)$ at r, but the magnitude will be proportional to nuclear magnetic dipole density $M(r)$ at r. The longitudinal relaxation properties of this magnetization is characterized in terms of a time parameter T1. After a time period comparable to T1, the polarizing magnetic field $p(r)$ is turned off.

Step 2: In the pure MDI method of the present invention, the next step is to measure at least one and possibly many component(s) of the magnetic field generated by the magnetic dipoles in the object. Several characteristics such as the direction, magnitude, and spatial derivatives of the magnetic field may be measured. This measurement is made in a 3D volume space V2 that in particular extends substantially along a radial direction pointing away from the approximate center of the object. This ensures capturing almost all available information for 3D image reconstruction. This measured data is recorded as a function of position r2 of points in the 3D volume space V2 as $g(r2)$;

Step 3: In the next step, a system matrix $H(r1,r2)$ is determined which specifies magnetic field intensity characteristics at any point r2 produced by a magnetic dipole source of unit strength located at any other point r1. This system matrix $H(r1,r2)$ is determined based on magnetic field propagation characteristics from a magnetic dipole, as well as magnetic field measurement apparatus characteristics such as direction and dimensions and geometry of magnetic flux sensor elements.

Step 4: In the next step, a linear system of equations compactly represented by a vector-matrix equation $g(r2)=H(r1, r2) f(r1)_+n(r2)$ is set up. Here $n(r2)$ represents noise in the measured data at point r2.

Step 5: In the next step, the vector-matrix equation $g(r2)=H(r1,r2) f(r1)+n(r2)$ is solved and a solution MO) for the 3D image $f(r1)$ is estimated. This is done using a method that reduces the effect of noise $n(r2)$ so that the estimated solution $f1(r1)$ is close to the desired correct solution $f(r1)$.

In Step 5 above, the vector-matrix equation $g(r2)=H(r1,r2) f(r1)+n(r2)$ often involves convolution operation involving $H(r1,r2)$ and $f(r1)$. In this case, solving this equation can be carried-out in the Fourier domain. This is done by computing the Fourier transforms of $g(r2)$, and $H(r1,r2)$, and then $f1(r1)$ is computed using inverse Fourier transform and inverse filtering in the Fourier domain. In this case computational cost is reduced significantly by solving in the Fourier domain instead of the spatial domain. The method above is a pure MDI method. It does not involve any sequential scanning of slices, columns, and rows of voxels through frequency and phase encoding of the spatial location of magnetic dipoles. Therefore it can be very fast and suitable for generating 3D video images. This is important for imaging of moving objects such as a heart. In other words, temporal resolution can be very high in this method compared to prior art. However this pure MDI requires a large number of magnetic filed measurements to be made at different r2. This number of measurements is at least equal to the number of object voxels in which the magnetic dipole strengths need to be determined. In many applications, this may require too many sensor elements, e.g. SQUIDS. This requirement can be avoided by combining this MDI with frequency and phase encoding techniques of MRI in prior art. In this mixed method, one or two spatial coordinates are encoded by frequency and/or phase encoding techniques. The remaining two or one coordinates are encoded by themselves with the MDI technique of measuring magnetic field along different radial distances and along one or more directions. In this combined method the following additional substep is used.

Step 1.1: After turning off the polarizing magnetic field $p(r)$, a pulse of readout or measurement magnetic field $Bm(r)$ is applied as in MRI. This field $Bm(r)$ is applied perpendicular to the original polarizing magnetic field $p(r)$. The magnetic resonance frequency or Larmor frequency is determined by this field $Bm(r)$. In addition and simultaneously while applying $Bm(r)$, another pulse of a frequency encoding gradient magnetic field Gx is applied along a first axis, say the x-axis. This has the effect of frequency encoding of the x-coordinate of the magnetic dipoles in voxels. In the next step (Step 1.2), the readout magnetic field $Bm(r)$ is reversed so as to generate a radio frequency gradient echo signal. This signal is measured at different r2 to obtain $B(k(t),r')=g(r_2,t)$. Corresponding to this step, at the end of Step 3 in pure MDI, the following substep (Step 3.1) is added. Frequency decoding is done on the frequency encoded time dependent measured data. This decoding step is carried-out through a Fourier transformation of measured data to obtain modified $g(r2)$. In this method, frequency encodes coordinates along one axis, and MDI encodes coordinates along the other two axes.

In another variation of the method, one coordinate is encoded by frequency, one by phase, and the third by MDI. In this method, Step 1.1 in the above method further includes the following additional substep of phase encoding.

Step 1.1.1: Apply a phase encoding gradient magnetic field Gy along a second axis or y-axis perpendicular to the first axis or x-axis. This encoding is decoded in Step 3.1 where a 2D Fourier transform is used to decode both frequency and phase to obtain a modified g(r2). The above methods can have an additional modification where simultaneously with the reversal of Bm(r), the field Gx is also reversed.

7. CONCLUSION, RAMIFICATIONS AND SCOPE OF THE INVENTION

The present invention provides a novel approach based on Field Paradigm for MDI, and MDI combined with MRI as well as MDI combined with Magnetic Polarization Encoding technique. The present invention is applicable to all magnetizable objects such as biological tissue, body organs in humans and animals, and liquids such as water and explosive liquids that can be detected at airport security check points. The present invention can be extended from magnetic dipoles to magnetic multi-poles and nuclear magnetic resonance spectroscopy for determining the material composition of objects. The present invention can be combined with a surgical table to provide a continuous and real-time feedback of MDI video images to a surgeon. MDI can work with ultra low field magnetic fields and ULF MRI, and therefore it is suitable for MDI guided surgery. The surgeon will be able to see all different voxels and layers inside tissues as well as the precise location of tumors and surgical instruments in real-time during surgery on a video display monitor. The fast imaging capability under low magnetic fields is a unique feature of MDI that is not found in prior art. In this sense, it breaks a major barrier to safe and minimally invasive surgery. The 3D MDI images of both surgical instruments and body tissue surrounding the location of the body tissue being operated upon can be seen by the surgeon performing the surgery. This reduces errors in surgical procedures and reduces invasiveness and surgical time duration. Many such applications and extensions of MDI are possible. While the description here of the methods, apparatuses, and applications contain many specificities, these should not be construed as limitations on the scope of the invention, but rather as exemplifications of preferred embodiments thereof. Further modifications and extensions of the present invention herein disclosed will occur to persons skilled in the art to which the present invention pertains, and all such modifications are deemed to be within the scope and spirit of the present invention as defined by the appended claims and their legal equivalents thereof.

What is claimed is:

1. A method of reconstructing a 3D image f(r1) that specifies a spatial density distribution of magnetic dipoles in an object in a 3D volume space V1 at each point r1, said method comprising the steps of:
   (a) applying a known polarizing magnetic field p(r) for a short time period of about 0.00001 second to 100 seconds in said 3D volume space V1 occupied by said object thus magnetically polarizing or magnetizing said object with magnetic dipole density distribution f(r1) and turning off said known polarizing magnetic field p(r);
   (b) measuring data that includes at least one component of magnetic field intensity characteristics generated by magnetic dipoles in said object, measurement being made in a 3D volume space V2 that in particular extends substantially along a radial direction pointing away from the approximate center of said object thereby obtaining information that includes variation of magnetic field at multiple points along said direction for 3D image reconstruction, and recording this measured data as a function of position r2 of points in said 3D volume space V2 as g(r2);
   (c) determining a system matrix H(r1,r2) that specifies magnetic field intensity characteristics at point r2 produced by a magnetic dipole source of unit strength located at point r1;
   (d) setting up a vector-matrix equation g(r2)=H(r1,r2) f(r1)+n(r2) where n(r2) represents noise in measured data at point r2; and
   (e) solving said vector-matrix equation g(r2)=H(r1,r2) f(r1)+n(r2) and obtaining a solution for said 3D image f(r1).

2. The method of claim 1 wherein Step (a) and Step (c) include additional substeps with Step (a) further including the following substeps:
   1) after turning off polarizing magnetic field p(r), applying a pulse of readout or measurement magnetic field Bm(r) perpendicular to original polarizing magnetic field p(r) and simultaneously applying another pulse of a frequency encoding gradient magnetic field Gx along a first axis or x-axis;
   2) reversing Bm so as to generate a radio frequency gradient echo signal;
   and Step (c) further including the substep of frequency decoding and phase decoding of any frequency and phase encoded time dependent data in measured data, this decoding step being carried-out through a Fourier transformation of measured data to obtain modified g(r2).

3. The method of claim 2 wherein substep (1) further includes the following additional substep: applying a phase encoding gradient magnetic field Gy along a second axis or y-axis perpendicular to said first axis or x-axis.

4. The method of claim 2 wherein substep (2) further includes the following additional substep: simultaneously with the reversal of Bm, also reversing Gx.

5. The method of claim 3 wherein substep (2) further includes the following additional substep: simultaneously with the reversal of Bm, also reversing Gx.

6. The method of claim 1 wherein said object is a mammal brain.

7. The method of claim 1 wherein said object is a mammal heart.

8. The method of claim 1 wherein magnetic field intensity characteristics includes at least one spatial derivative of magnetic field intensity.

9. The method of claim 1 wherein said vector-matrix equation g(r2)=H(r1,r2) f(r1)+n(r2) involves convolution of H(r1, r2) and f(r1) and Step (e) is carried-out in the Fourier domain by computing the Fourier transforms of g(r2), and H(r1,r2).

* * * * *